(12) United States Patent
Kim et al.

(10) Patent No.: US 9,478,612 B2
(45) Date of Patent: Oct. 25, 2016

(54) THIN FILM TRANSISTOR AND DISPLAY DEVICE USING THE SAME

(71) Applicant: LG DISPLAY CO., LTD., Seoul (KR)

(72) Inventors: Mingyeong Kim, Gunpo-si (KR); Hun Jeoung, Paju-si (KR); Hyuncheol Jang, Gunsan-si (KR); Moon Seok Jung, Cheonan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/815,463

(22) Filed: Jul. 31, 2015

(65) Prior Publication Data

US 2016/0035830 A1 Feb. 4, 2016

(30) Foreign Application Priority Data

Jul. 31, 2014 (KR) .......................... 10-2014-0098657

(51) Int. Cl.

| | |
|---|---|
| *H01L 29/10* | (2006.01) |
| *H01L 29/12* | (2006.01) |
| *H01L 29/06* | (2006.01) |
| *H01L 29/417* | (2006.01) |
| *H01L 29/786* | (2006.01) |
| *H01L 27/12* | (2006.01) |

(52) U.S. Cl.
CPC ........ *H01L 29/0692* (2013.01); *H01L 27/1225* (2013.01); *H01L 29/41733* (2013.01); *H01L 29/7869* (2013.01); *H01L 29/78618* (2013.01); *H01L 29/78696* (2013.01)

(58) Field of Classification Search
CPC .......... H01L 29/0692; H01L 27/1225; H01L 29/41733; H01L 29/7869; H01L 29/78696; H01L 29/78618
See application file for complete search history.

(56) References Cited

U.S. PATENT DOCUMENTS

| 2012/0256176 A1 | 10/2012 | Yang et al. | |
| 2014/0167040 A1* | 6/2014 | Lee | H01L 29/66969 257/43 |
| 2014/0239290 A1* | 8/2014 | Kim | H01L 29/7869 257/43 |
| 2014/0284558 A1* | 9/2014 | Yang | H01L 27/3262 257/40 |
| 2014/0334227 A1 | 11/2014 | Ueda | |

FOREIGN PATENT DOCUMENTS

WO  2013080784 A1  6/2013

* cited by examiner

*Primary Examiner* — Victor A Mandala
(74) *Attorney, Agent, or Firm* — Dentons US LLP

(57) ABSTRACT

A display panel including an oxide thin film transistor is disclosed. In the oxide thin film transistor, a part of the active layer between a source region and a drain region is covered with an etch stopper layer, and the etch stopper layer is partially covered by the first electrode and the second electrode of the oxide thin film transistor. The length in which the etch stopper layer is overlapped by the second electrode is greater than the length in which the etch stopper layer is overlapped by the first electrode to suppress threshold voltage shift in the oxide thin film transistor.

20 Claims, 11 Drawing Sheets

THIN FILM TRANSISTOR AND DISPLAY DEVICE USING THE SAME

CROSS REFERENCE TO RELATED APPLICATIONS

This application claims the benefit of Korean Patent Application No. 10-2014-0098657 filed on Jul. 31, 2014, which is hereby incorporated by reference for all purposes as if fully set forth herein.

BACKGROUND OF THE INVENTION

1. Field of the Invention

The present invention relates to a display device. More particularly, the present invention relates to a display device including an oxide thin film transistor.

2. Discussion of the Related Art

Flat panel displays (FPDs) include: liquid crystal display device (LCD), a plasma display panel device (PDP), an organic light emitting display device (OLED), and an electrophoretic display device (EPD) and so forth. The FPDs are provided in a relatively thin package that is suitable for use in a variety of electronic goods. As such, FPDs are commonly employed in a wide variety of electronic devices, such as televisions, computers, and handheld devices (e.g., cellular telephones, audio and video players, gaming systems, and so forth). Among the various FPDs, the liquid crystal display device and the organic light emitting display device, which include a thin film transistor, typically use less power than comparable display technologies, making them suitable for use in battery-powered devices or in other contexts where it is desirable to minimize power usage.

The performance of FPDs may be measured with respect to a variety of factors. For example, some characteristics of interest with respect to a FPD may include transmittance (luminance), color accuracy, power efficiency, as well as operating stability. The thin film transistors used in FPD are often closely related to those characteristics of the FPDs. Accordingly, research regarding an oxide thin film transistor for FPDs has been actively conducted.

When fabricating an oxide thin film transistor (TFT) during manufacturing of a display panel, alignment may stray away from the original design of the TFT. The misalignment during the fabrication of the TFT may cause a short channel phenomenon, in which the channel length of the TFT becomes short due to a drain bias.

Drain-induced barrier lowering (DIBL) occurs due to the short channel phenomenon, whereby a threshold voltage Vth of the thin film transistor is shifted in a negative direction. The negative direction indicates a direction toward a negative voltage. For example, the negative voltage may be a voltage less than 0V. In some cases, electrodes and the active layer of the TFT may not be properly aligned in reference to each other, and an unintended current path can be formed by the part of the active layer exposed outside the electrodes (i.e., part of the active layer other than the part between the source and drain, which is intended for providing the channel in the TFT). Current may flow into the exposed area of the active layer, creating an unintended current path in the TFT, known as a side channel, which may shift the threshold voltage of the oxide thin film transistor in the negative direction. As the threshold voltage is shifted in the negative direction, stability of the thin film transistor may be hampered, which in turn reduces the lifetime of the display panel.

SUMMARY OF THE INVENTION

Accordingly, the present invention is directed to a thin film transistor and a display device using the same, which substantially obviate one or more problems due to limitations and disadvantages of the related art.

An advantage of the present invention is to provide a display panel including an oxide thin film transistor, in which the source electrode and the drain electrode of the TFT are configured to suppress the threshold voltage shift of the TFT.

Additional advantages and features of the invention will be set forth in part in the description which follows and in part will become apparent to those having ordinary skill in the art upon examination of the following or may be learned from practice of the invention. These other advantages of the invention may be realized and attained by the structure particularly pointed out in the written description and claims hereof as well as the appended drawings.

Accordingly, the display panel includes an oxide TFT in which one of the source electrode and drain electrode of the oxide TFT extends more onto the etch stopper layer towards the other electrode. That is, on the etch stopper layer at the central portion of the active layer, the length in which the drain electrode is extended toward the source electrode is greater than the length in which the source electrode is extended toward the drain electrode.

More specifically, in an embodiment, a thin film transistor comprises an oxide semiconductor active layer, a gate electrode, a first electrode in contact with a source region of the active layer and a second electrode in contact with a drain region of the active layer. A gate insulating film is provided between the gate electrode and the active layer. Further, an etch stopper layer is provided on the active layer. The first electrode and the second electrode are arranged such that they are partially extended onto the etch stopper layer positioned between the source region and the drain region of the active layer. In this regard, the length of the second electrode extended toward the first electrode on the etch stopper layer is longer than a length of the first electrode extended toward the second electrode on the etch stopper layer.

In some embodiments, a display device including an oxide TFT, in which a first electrode and a second electrode of the oxide TFT are configured to suppress the occurrences of the side channel in the TFT, thereby minimizing the threshold voltage shift of the TFT.

In some embodiments, a display device comprises a thin film transistor (TFT), in which the TFT is provided with an oxide semiconductor active layer, a gate electrode, a first electrode in contact with a source region of the active layer and a second electrode in contact with a drain region of the active layer. A gate insulating film is provided between the gate electrode and the active layer. Further, an etch stopper layer is provided on the active layer. The first electrode and the second electrode are arranged such that they are partially extended onto the etch stopper layer positioned between the source region and the drain region of the active layer. In this regard, the length of the second electrode extended toward the first electrode on the etch stopper layer is longer than a length of the first electrode extended toward the second electrode on the etch stopper layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, the present invention will be described in detail with reference to the accompanying drawings.

Figure 1:
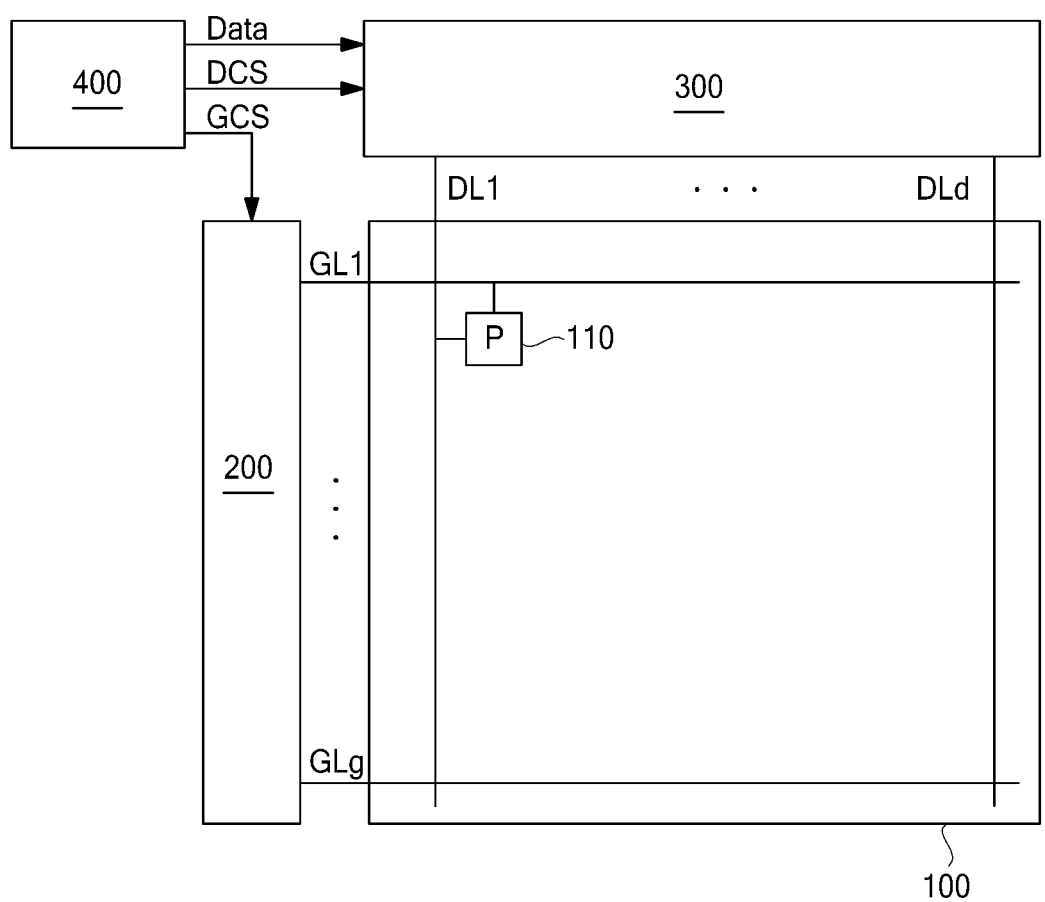
FIG. 1 is a schematic illustration of a display device according to an embodiment of the present invention.

FIG. 1 is a schematic illustration of a display device according to an embodiment of the present invention.

The display device according to an embodiment of the present invention, as shown in FIG. 1, includes a panel 100 provided with a pixel 110 formed per crossing area of gate lines GL1 to GLg and data lines DL1 to DLd, a gate driver 200 for sequentially supplying scan pulses to the gate lines GL1 to GLg formed in the panel 100, a data driver 300 for supplying a data voltage to the data lines DL1 to DLd formed in the panel 100, and a timing controller 400 for controlling functions of the gate driver 200 and the data driver 300.

The panel 100 may be, for example, a liquid crystal display panel. A plurality of data lines DL1 to DLd and a plurality of gate lines GL1 to GLg are provided on a lower substrate (TFT substrate) of the panel 100. An oxide thin film transistor is provided in each of the pixel areas P 110, which is at the crossings of the data lines DL1 to DLd and the gate lines GL1 to GLg. Also included in the pixel area 110 is a pixel electrode, which is connected to the oxide thin film transistor. The pixel electrode is provided with the data signal, and, in conjunction with a common electrode, generates electrical field across the liquid crystal to control the operation of the display panel.

In other words, the pixels are arranged in a matrix configuration by the crossing structure of the data lines DL1 to DLd and the gate lines GL1 to GLg, and the oxide thin film transistor, the pixel electrode and the common electrode are formed in each of the pixels. On an upper substrate (CF substrate) of the panel 100, a black matrix (BM) and a color filter are formed.

A polarizing plate is attached to each of the upper substrate and the lower substrate of the panel 100, and an alignment film for setting a pre-tilt angle of the liquid crystal is formed on an inner surface which is in contact with the liquid crystal. Each of the upper and lower substrates may be a glass material. A column spacer (CS) for maintaining a cell gap may be formed between the upper substrate and the lower substrate of the panel 100.

For convenience of description in this specification, although the present invention has been described based on the liquid crystal display panel as an example, the present invention may be applied to other types of display panels (for example, liquid crystal display panel, organic light emitting display panel, etc.) so long as it includes the oxide thin film transistor described in this disclosure.

Figure 2A:
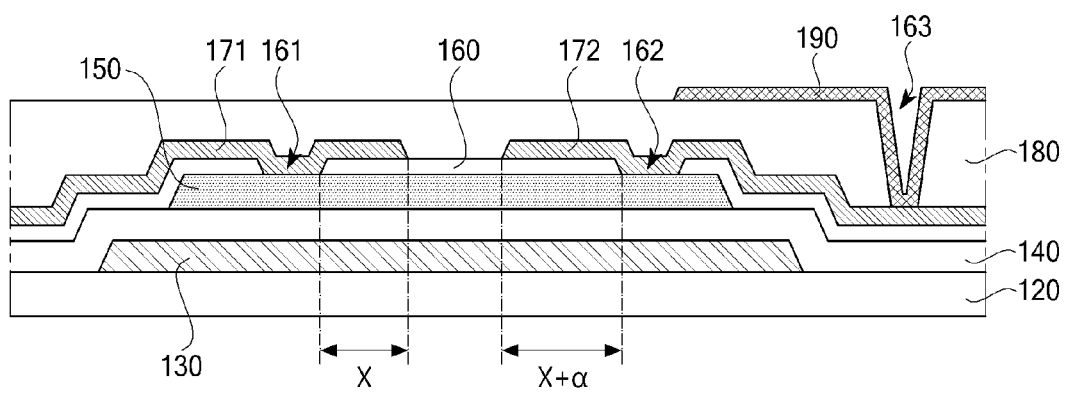
FIG. 2A is a cross-sectional view illustrating an exemplary configuration of a pixel in a display device according to an embodiment of the present invention.
Figure 2B:
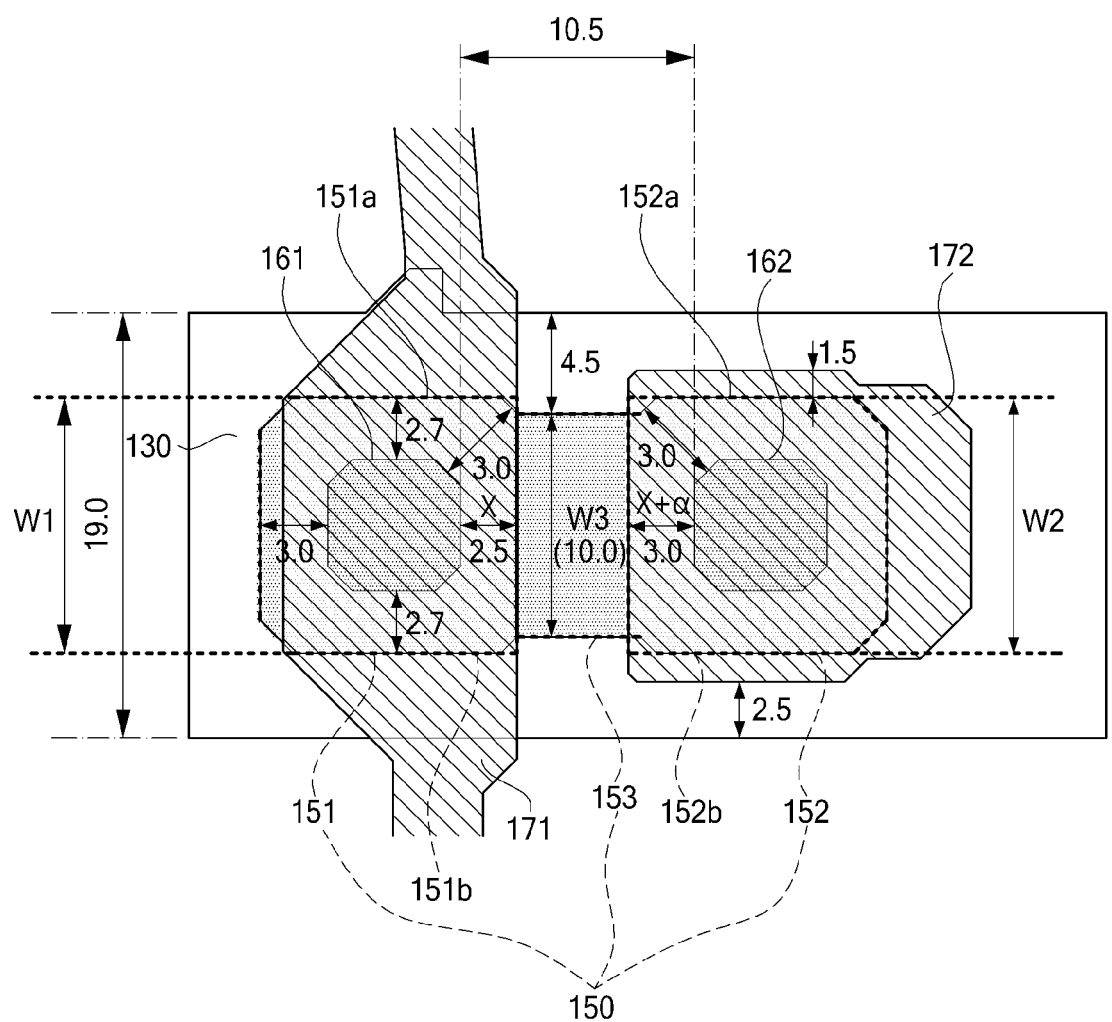
FIG. 2B is a plane view briefly illustrating an exemplary configuration of an oxide thin film transistor in a display device according to an embodiment of the present invention.
Figure 2C:
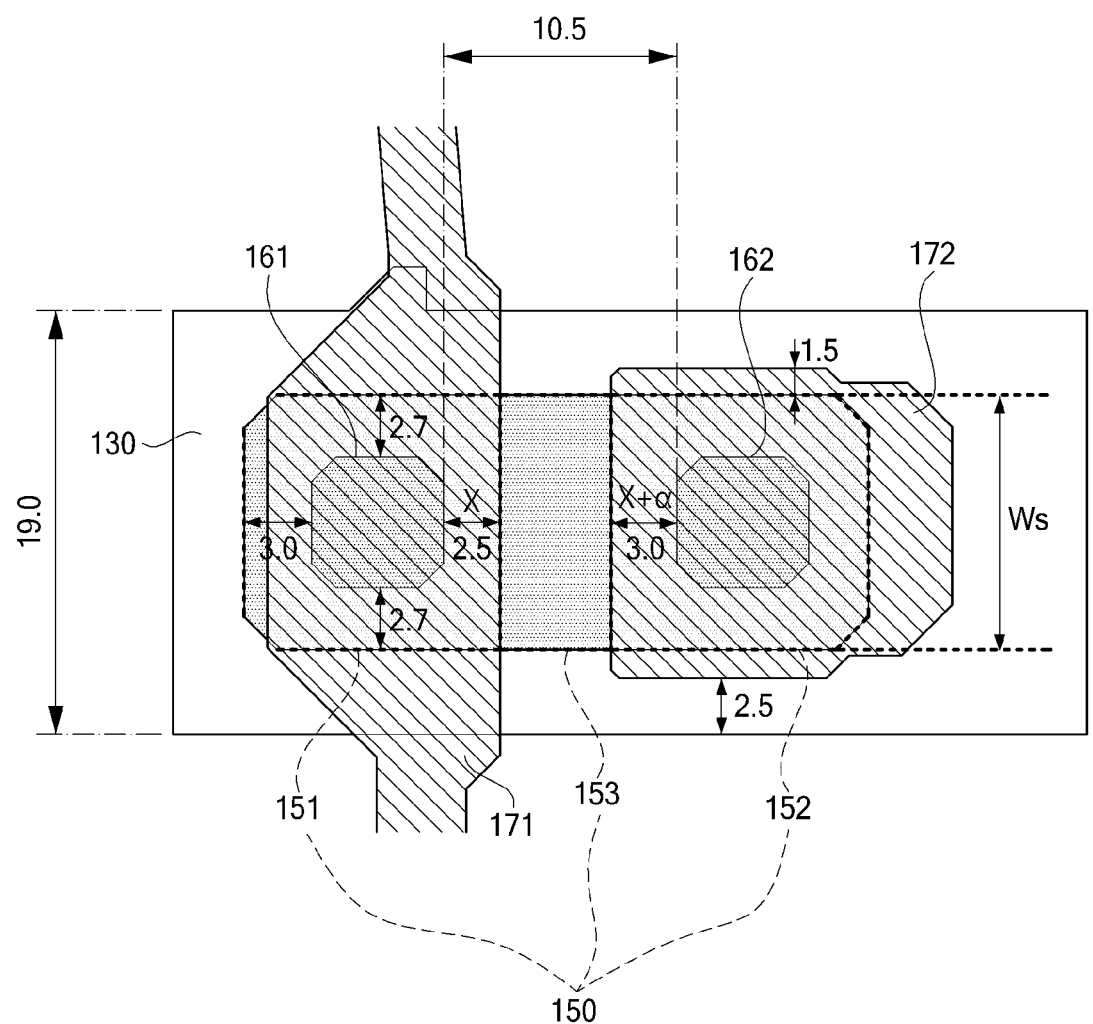
FIG. 2C is a plane view briefly illustrating an exemplary configuration of an oxide thin film transistor in a display device according to an embodiment of the present invention.

FIG. 2A is a cross-sectional view illustrating an exemplary configuration of a pixel in a display device according to an embodiment of the present invention. FIG. 2B is a plane view illustrating an exemplary configuration of an oxide thin film transistor having a dumbbell shaped active layer employed in a display device, according to an embodiment of the present invention. FIG. 2C is a plane view briefly illustrating an exemplary configuration of an oxide thin film transistor having a bar shaped active layer employed in a display device, according to an embodiment of the present invention. The dimensions (numerical values) denoted in the figures are in micrometer (μm).

As shown in FIG. 2A, each pixel of a display device includes a gate electrode 130 disposed on a substrate 120. The substrate 120 can be a glass substrate. It should be appreciated that the display device of the present disclosure employees the TFTs with oxide semiconductor (referred hereinafter as "Oxide TFT"). Deposition of the oxide semiconductor layer for a display panel typically involves lower temperature processes than the deposition of poly-silicon semiconductor layer. The substrate 120 may also be formed of a plastic material.

The gate electrode 130 is disposed on the substrate 120. Although not shown in FIG. 2A, the gate electrode 130 is connected to one of a plurality of gate lines disposed on the substrate 120. The gate electrode 130 may be formed in such a manner that a conductive material used as the gate electrode 130 is deposited on an entire surface of the substrate 120 and then patterned. The gate electrode 130 can be formed of one or more of low resistance metal materials, including but not limited to, aluminum (Al), Al alloy, tungsten (W), copper (Cu), nickel (Ni), chromium (Cr), molybdenum (Mo), titanium (Ti), platinum (Pt), tantalum (Ta) and a combination thereof.

A gate insulating film 140 is formed on the gate electrode 130 such that the gate insulating film 140 is interposed between the gate electrode 130 and the active layer 150. The gate insulating film 140 may be formed to cover the entire surface of the gate electrode 130. The gate insulating film 140 may be formed of an inorganic insulating material such as $SiO_2$ and $SiN_x$.

The active layer 150 is placed on the gate insulating film 140. The active layer 150 is an oxide semiconductor for forming a channel between the first electrode 171 and the second electrode 172. The active layer 150 may be formed of an oxide semiconductor such as IGZO (Indium Gallium Zinc Oxide), SnO (Tin Oxide), and ZnO (Zinc Oxide).

The oxide semiconductor combines the low cost and scalability of an amorphous silicon semiconductor with the high performance of the poly-silicon semiconductor. The oxide semiconductor active layer 150 allows for a decent level of electron mobility, offering 20 to 50 times the electron mobility of amorphous silicon. Although, the mobility isn't as high as a poly-silicon semiconductor, the oxide semiconductor active layer 150 has a much lower off-current than the poly-silicon semiconductor, which provides added benefit of lower power consumption in the display device. Such properties allow the pixels to maintain their charge for a longer period of time, which improves battery life as well as helps to create a constantly high quality image. Furthermore, the TFT can be less visible with the oxide semiconductor active layer 150 than it is with other types of semiconductor. As such, the design possibilities for the display device (for example, liquid crystal display device, organic light emitting display device, transparent display device, etc.) of the present invention is expanded by the use of oxide semiconductor based active layer 150.

As shown in FIGS. 2A-2C, the active layer 150 includes a first area 151 (i.e., source region) overlapped with the first electrode 171, a second area 152 (i.e., drain region) overlapped with the second electrode 172, and a third area 153 (i.e., intermediate area) disposed between the first area 151 and the second area 152.

In this case, a width W3 of the third area 153 is more narrow than a width W1 of the first area 151 and a width W2 of the second area 152. For example, as shown in FIG. 2B, if the width W3 of the third area 153 is 10 μm, the width W1 of the first area 151 and the width W2 of the second area 152 may be 11.4 μm. Since the two opposite end portions (i.e., first area 151, second area 152) of the active layer 150 are wider than the central portion (i.e., third area 153) of the active layer 150, the active layer 150 may be referred as the "dumbbell type" in this specification.

An etch stopper layer 160 is disposed on the active layer 150. The etch stopper layer 160 is formed to cover the first area 151, the second area 152 and the third area 153 (i.e., intermediate area) of the active layer 150 to protect the active layer 150 from being damaged during manufacturing processes of the display device performed after the formation of the active layer 150. For instance, the etch stopper layer 160 can protect the active layer 150 when forming the data lines DL as well as the electrodes for the oxide TFT.

In some embodiments, the oxide TFT can be provided as a hole type as depicted in FIGS. 2A-2C, in which a first contact hole 161 and a second contact hole 162 are provided through the etch stopper layer 160. It should be noted that, in some other embodiments, an island type oxide TFT can be used in the display device, in which the first area 151 and the second area 152 of the active layer 150 are not covered by the etch stopper layer 160. In the island type oxide TFT, the source and the drain electrodes of the oxide TFT are placed directly on the appropriate parts (i.e., source/drain regions) of the active layer 150 without the contact holes.

In the hole type oxide TFT shown in FIGS. 2A-2C, a first electrode 171, which is connected with a data line of the display panel, is in contact with a first area 151 of the active layer 150 through the contact hole 161. A second electrode 172, which is connected with the pixel electrode 190, is in contact with a second area 152 of the active layer 150 through the contact hole 162.

As shown in FIG. 2B, the first electrode 171 is arranged on the active layer 150 such that the first edge 151a and the second edge 151b of the first area 151 of the active layer 150 are covered by the first electrode 171 provided thereon. In other words, the first area 151 of the active layer 150 has the first edge 151a and the second edge 151b parallel to the first edge 151a, which are not exposed outside the first electrode 171 provided on the first area 151 of the active layer 150.

Similarly, the second electrode 172 is arranged on the active layer 150 such that the first edge 152A and the second edge 152B of the second area 152 of the active layer 150 are covered by the second electrode 172 provided thereon. In other words, the second area 152 of the active layer 150 has the first edge 152A and the second edge 152B parallel to the first edge 152A, which are not exposed outside the second electrode 172 provided on the second area 152 of the active layer 150.

Further, the first electrode 171 and the second electrode 172 are arranged to extend onto the etch stopper layer 160 disposed on the center of the active layer 150. In this regard, the length of the second electrode 172 extended toward the first electrode 171 on the etch stopper layer 160 can be equal to or greater than the length of the first electrode 171 extended toward the second electrode 172 on the etch stopper layer 160. That is, the length in which the part of the second electrode 172 being positioned on the etch stopper layer 160 (i.e., X+α) may be the same or greater than the length of which the part of the first electrode 171 being positioned on the etch stopper layer 160 (i.e., X). The length X is measured from the edge of the etch stopper layer 160, which is closer to the first electrode 171, to the end of the first electrode 171 on the etch stopper layer 160, which is closer to the second electrode 172. The length X+α is measured from the edge of the etch stopper layer 160, which is closer to the second electrode 172, to the end of the second electrode 172 on the etch stopper layer 160 closer to the first electrode 171.

However, it is preferred that the extra length α of the second electrode 172 on the etch stopper layer 160 is about 0.5 μm or more. For instance, when the length X of the part of the first electrode 172 placed on the etch stopper layer 160 disposed on the third area 153 is 2.5 μm, the length X+α of the part of the second electrode 172 placed on the etch stopper layer 160 disposed on the third area 153 may be 3.0 μm.

A passivation layer 180 is provided on the first electrode 171, the second electrode 172 and the etch stopper layer 160 exposed between the first electrode 171 and the second electrode 172. A pixel electrode 190 provided on the passivation layer 180, and the pixel electrode 190 is connected with the second electrode 172 through a third contact hole 163 formed through the passivation layer 180.

FIG. 2C illustrates an exemplary configuration of an oxide TFT employed in a display device, according to an embodiment of the present invention. The oxide TFT shown in FIG. 2C includes a gate electrode 130, a gate insulating film 140 formed on the gate electrode 130, and an active layer 150 formed on the gate insulating film 140, which are similar to those described above in reference to FIG. 2B.

Also, the active layer 150 includes a first area 151 overlapped with the first electrode 171 which is in contact with the active layer through the first contact hole 161, a second area 152 overlapped with the second electrode 172 which is in contact with the second contact hole 162, and a third area 153 formed between the first area 151 and the second area 152.

In this example, however, all of the first area 151, the second area 152 and the third area 153 of the active layer 150 have substantially the same width Ws. In way of an example, the width Ws of the first area 151, the second area 152 and the third area 153 may all be about 11.4 μm as shown in FIG. 2C. Of course, the width Ws at the first area 151, the second area 152 and the third area 153 may differ from each other due to manufacturing margin, which should be less than 0.5 μm. Since the central portion (i.e., the third area 153) of the active layer 150 has the same width as the two opposite end portions (i.e., first area 151, second area 152) of the active layer 150, such an active layer 150 may be referred as the "bar type" in this specification.

The etch stopper layer 160 is formed on the first area 151, the second area 152 and the third area 153 of the active layer 150. The etch stopper layer 160 can be formed as a hole type, in which a first contact hole 161 for electrically connecting the active layer 150 with the first electrode 171 and a second contact hole 162 for electrically connecting the active layer 150 with the second electrode 172 are patterned.

A first electrode 171, which is connected with a data line of the display panel, is in contact with a first area 151 of the active layer 150 through the contact hole 161. A second electrode 172, which is connected with the pixel electrode 190, is in contact with a second area 152 of the active layer 150 through the contact hole 162.

Even when the oxide TFT uses a bar type active layer 150, the first electrode 171 is arranged on the active layer 150 such that the first edge 151*a* and the second edge 151*b* of the first area 151 of the active layer 150 are covered by the first electrode 171 provided thereon. In other words, the shape and the size of the first electrode 171 should be sufficient to cover the first edge 151*a* and the second edge 151*b* at the first area 151 of the active layer 150. As shown in FIG. 2C, the first electrode 171 is arranged orthogonal to the active layer 150 so that the first electrode 171 extends across the first edge 151*a* and the second edge 151*b* parallel to the first edge 151*a* of the first area of the active layer 150.

Similarly, the second electrode 172 arranged on the active layer 150 has a size that is sufficient to extend across the first edge 152A and the second edge 152B of the second area 152 of the active layer 150. In other words, the second area 152 of the active layer 150 has the first edge 152A and the second edge 152B parallel to the first edge 152A, and the second electrode 172 extended across the active layer 150. As such, the first edge 152A and the second edge 152 at the second area 152 of the active layer 150 are not exposed outside the second electrode 172.

The first electrode 171 and the second electrode 172 are arranged to extend onto the etch stopper layer 160 disposed on the center of the active layer 150. In this regard, the length of the second electrode 172 extended toward the first electrode 171 on the etch stopper layer 160 is greater than the length of the first electrode 171 extended toward the second electrode 172 on the etch stopper layer 160. That is, the length in which the part of the second electrode 172 being positioned on the etch stopper layer 160 (i.e., X+α) is longer than the length of which the part of the first electrode 171 being positioned on the etch stopper layer 160 (i.e., X). The length X is measured from the edge of the etch stopper layer 160, which is closer to the first electrode 171, to the end of the first electrode 171 on the etch stopper layer 160, which is closer to the second electrode 172. The length X+α is measured from the edge of the etch stopper layer 160, which is closer to the second electrode 172, to the end of the second electrode 172 on the etch stopper layer 160 closer to the first electrode 171.

A passivation layer 180 is provided on the first electrode 171, the second electrode 172 and the etch stopper layer 160 exposed between the first electrode 171 and the second electrode 172. A pixel electrode 190 provided on the passivation layer 180, and the pixel electrode 190 is connected with the second electrode 172 through a third contact hole 163 formed through the passivation layer 180.

Figure 3A:
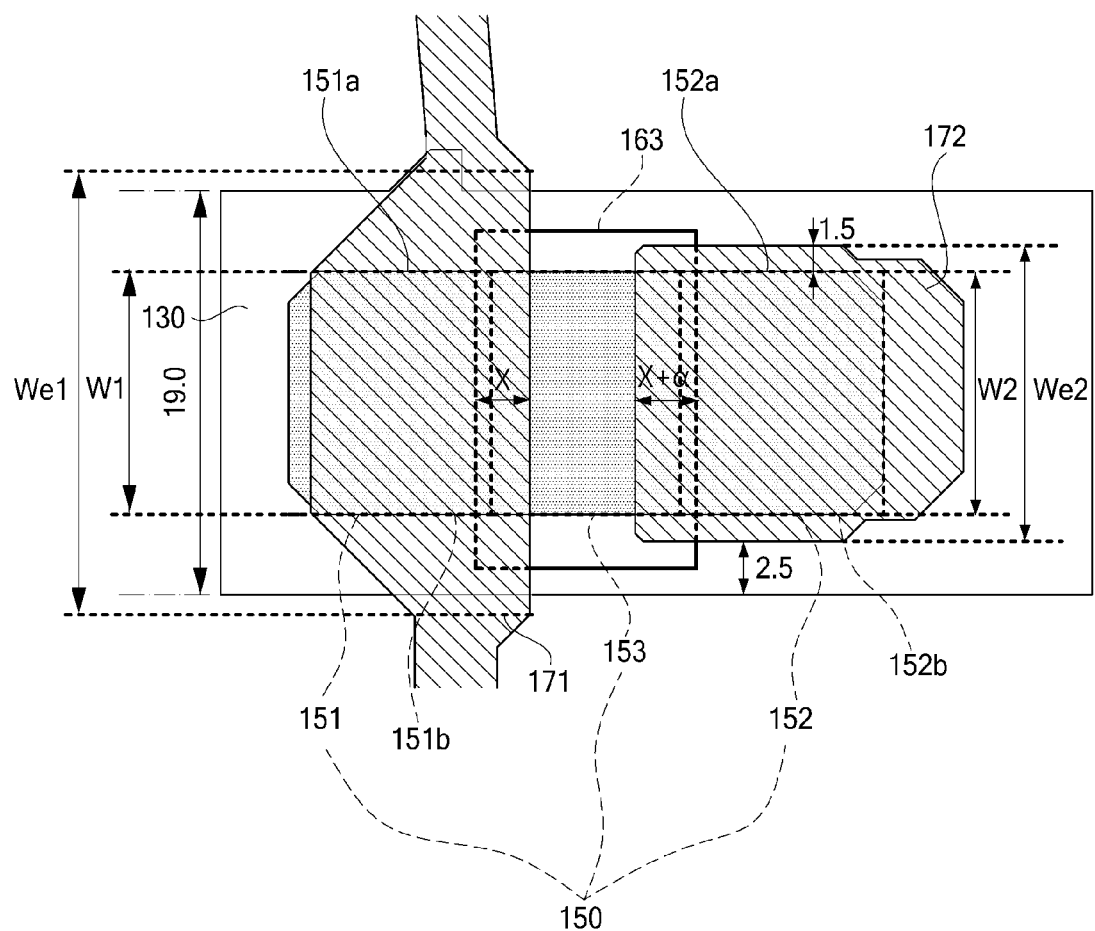
FIG. 3A is a plane view briefly illustrating an exemplary configuration of an oxide thin film transistor in a display device according to an embodiment of the present invention.
Figure 3B:
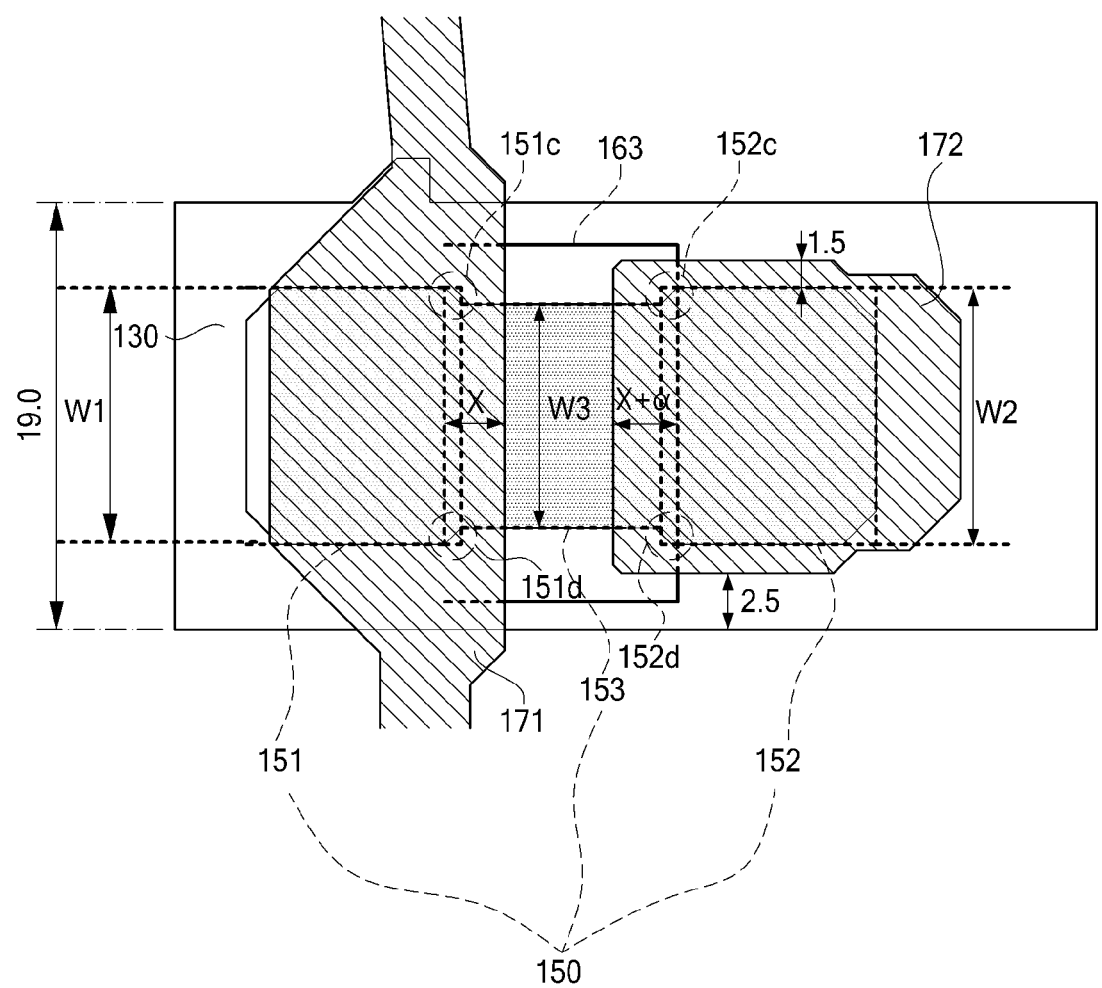
FIG. 3B is a plane view briefly illustrating an exemplary configuration of an oxide thin film transistor in a display device according to an embodiment of the present invention.
Figure 3C:
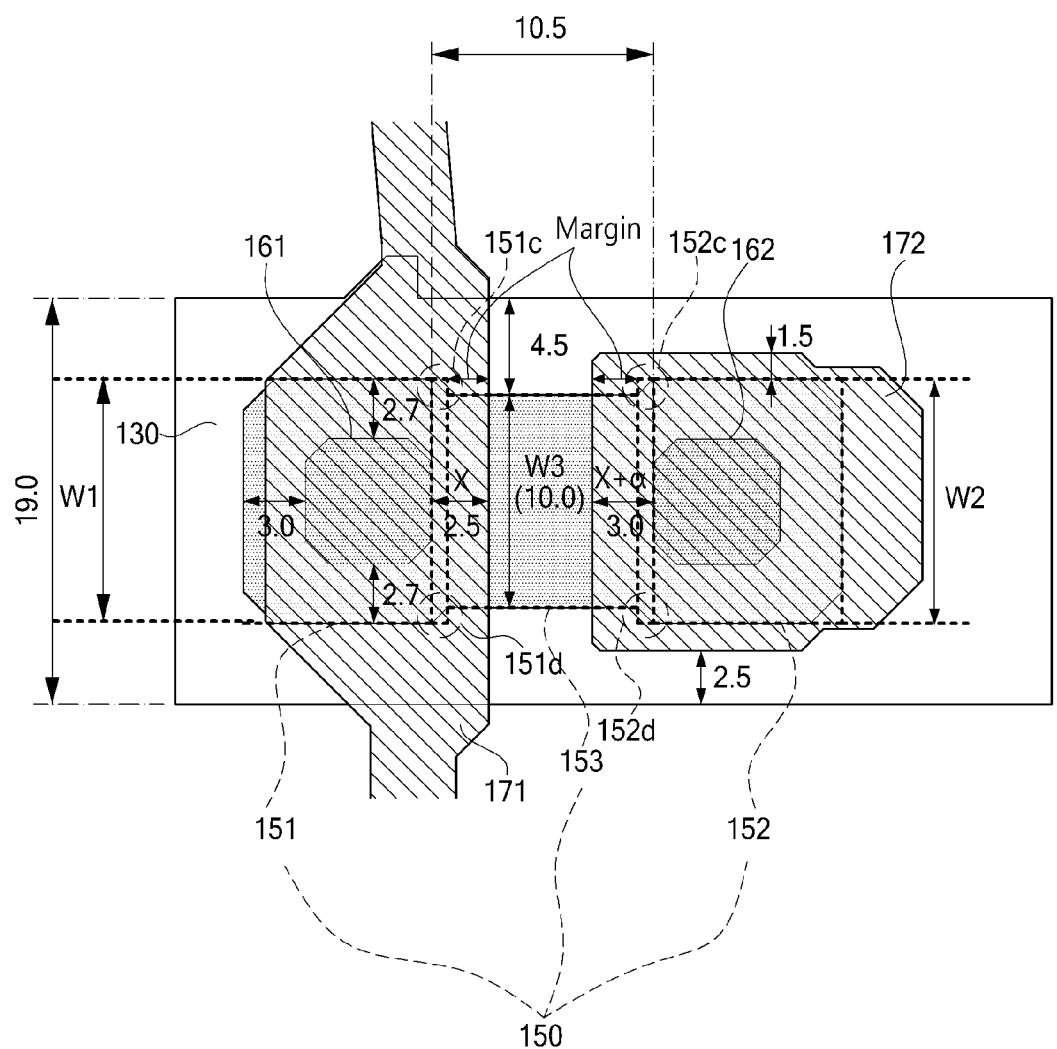
FIG. 3C is a plane view briefly illustrating an exemplary configuration of an oxide thin film transistor in a display device according to an embodiment of the present invention.

FIGS. 3A, 3B and 3C each illustrate an exemplary configuration of an oxide thin film transistor that can be employed in embodiments of the display device. The dimensions (numerical values) denoted in the figures are in micrometer (μm).

FIG. 3A illustrates an exemplary configuration of an island type oxide TFT with a bar type active layer. FIG. 3B illustrates an exemplary configuration of an island type oxide TFT with a dumbbell type active layer. FIG. 3C illustrates an exemplary configuration of a hole type oxide TFT with a dumbbell type active layer.

Referring to FIG. 3A, a pixel of a display device includes a gate electrode 130 connected to a gate line GL, a gate insulating film 140 formed on the gate electrode 130, and an active layer 150 formed on the gate insulating film 140.

The active layer 150 includes a first area 151 (e.g., source region), a second area 152 (e.g., drain region) and a third area 153 formed between the first area 151 and the second area 153 (e.g., channel region). As mentioned before, the bar type active layer 150 has substantially the same width in each of the first area 151, the second area 152 and the third area 153 of the active layer 150.

In the example depicted in FIG. 3A, the central portion of the active layer 150 (i.e., the third area 153) is covered with the etch stopper layer 160, whereas the first area 151 and the second area 152 of the active layer 150 at the opposite side of the third area 153 are exposed without the etch stopper layer 160.

The first electrode 171 and the second electrode 172 are arranged over the first area 151 and the second area 152 of the active layer 150. Also, the first electrode 171 on the first area 151 of the active layer 150 is extended onto the etch stopper layer 160 placed on the third area 153 of the active layer 150. Likewise, the second electrode 172 provided on the second area 152 of the active layer 150 is extended onto the etch stopper layer 160 placed on the third area 153 of the active layer 150. The length X+α in which the second electrode 172 is extended over onto the etch stopper layer 160 toward the first area 151 is greater than the length X of which the first electrode 171 is extended over onto the etch stopper layer 160 toward the second area 152. The first electrode 171 may be a part of the data line, or otherwise connected to a data line of the display device. The second electrode 172 may be connected to a pixel electrode of the display device.

Also, the first electrode 171 is arranged over the first area 151 of the active layer 150 so as to cover the first edge 151*a* and the second edge 151*b* of the first area 151, which are parallel to each other. The second electrode 172 is also arranged over the second area 152 of the active layer 150 so as to cover the first edge 152A and the second edge 152B at the second area 152 of the active layer 150.

More specifically, the first edge 151*a* and the second edge 151*b* are distanced from each other by the width W1 of the first area 151. The first edge 152B and the second edge 152B are distanced from each other by the width W2 of the second area 152. The width We1 of the first electrode 171 and the width We2 of the second electrode 172 are wider than a width (W1, W2, W3) of the active layer 150. Accordingly, the first edge 151*a* and the second edge 151*b* at the first area 151 of the active layer 150 are overlapped by the first electrode 171, which is extending across the first area 151 of the active layer 150. Likewise, the first edge 152A and the second edge 152B at the second area 152 of the active layer 150 are overlapped by the second electrode 172, which is provided over the second area 152 of the active layer 150. By way of an example, the second electrode 172 may be arranged on the second area 152 of the active layer 150 such that the edges of the second electrode 172 are positioned about 1.5 μm outside the first edge 152A and the second edge 152B of the second area 152 of the active layer 150 as depicted in FIG. 3A.

Referring to FIG. 3B, an island type oxide TFT of the display device can be provided with a dumbbell type active layer 150. With the dumbbell type active layer 150, the width W3 of the third area 153 is more narrow than the width W1 of the first area 151 and the width W2 of the second area 152.

In the island type TFT, the central portion (i.e., the third area 153) of the active layer 150 is covered by the etch stopper layer 160, but the first area 151 and the second area 152 at the opposite sides of the central portion are exposed without being covered by the etch stopper layer 160.

The first electrode 171 and the second electrode 172 are arranged over the first area 151 and the second area 152 of the active layer 150. Also, the first electrode 171 on the first area 151 of the active layer 150 is extended onto the etch stopper layer 160 placed on the third area 153 of the active layer 150. Likewise, the second electrode 172 provided on the second area 152 of the active layer 150 is extended onto the etch stopper layer 160 placed on the third area 153 of the active layer 150.

As other configurations of the oxide TFT described above, the etch stopper layer 160 disposed on the center of the active layer 150 is partially covered by the first electrode 171 and also partially covered by the second electrode 172. The length X+α of the second electrode 172 extended toward the first area on the etch stopper layer 160 is longer than the length X of the first electrode 171 extended toward the second area on the etch stopper layer 160.

As shown in FIG. 3B, the first corner 151C and a second corner 151D of the first area 151 that are positioned toward the third area 153 are also covered under the first electrode 171. That is, the corners 151C, 151D at the border between the first area 151 and the third area 153 are fully overlapped by the first electrode 171. Similarly, the first corner 152C and the second corner 152D of the second area 152 that are positioned toward the third area 153 are covered under the second electrode 172. That is, the corners 152C, 152D at the border between the second area 152 and the third area 153 are fully overlapped by the second electrode 172.

Referring to FIG. 3C, a hole type oxide TFT is provided with a dumbbell type active layer 150, in which the width W3 of the third area 153 is more narrow than the width W1 of the first area 151 and the width W2 of the second area 152.

A etch stopper layer 160 on the active layer 150 is provided with a first contact hole 161 and a second contact hole 162 for electrically connecting the first electrode 171 and the second electrode 172 to the first area 151 and the second area 152 of the active layer 150, respectively. In other words, the etch stopper layer 160 is formed on the first area 151, the second area 152 and the third area 153 of the active layer 150, and the first electrode 171 is connected with the first area 151 through the first contact hole 161 formed in the etch stopper layer 160, and the second electrode 172 is connected with the second area 152 through the second contact hole 162 formed in the etch stopper layer 160.

The first electrode 171 is formed to have an area greater than that of the first area 151, whereby the first electrode 171 covers the first area 151 and is connected with the data line. The second electrode 172 is also formed to have an area greater than that of the second area 152, whereby the second electrode 172 covers the second area 152 and is connected with the pixel electrode 190 formed in the pixel.

The first electrode 171 is formed to be extended above a part of the etch stopper layer 160 disposed on the third area 153. The second electrode 172 is also formed to be extended above a part of the etch stopper layer 160 disposed on the third area 153. The length X+α in which the second electrode 172 is extended over onto the etch stopper layer 160 toward the first area 151 may be greater than the length X of which the first electrode 171 is extended over onto the etch stopper layer 160 toward the second area 152.

As shown in FIG. 3C, the first corner 151C and a second corner 151D of the first area 151 that are positioned toward the third area 153 are covered under the first electrode 171. Similarly, the first corner 152C and the second corner 152D of the second area 152 that are positioned toward the third area 153 are covered under the second electrode 172. That is, in case of the dumbbell type active layer 150, the first electrode 171 is extended on the etch stopper layer 160 at the active layer's central portion (i.e., the third area 153) such that the first corner 151C and the second corner 151D are covered under the first electrode 171. Likewise, the second electrode 172 is extended on the etch stopper layer 160 at the active layer's central portion (i.e., the third area 153) and covers the first corner 152C and the second corner 152D of the active layer's second area 152.

The first electrode 171 and the second electrode 172 are arranged over the first area 151 and the second area 152 of the active area 150 with a predetermined margin, which would ensure that the first corner 151C and the second corner 151D of the first area 151 as well as the first corner 152C and the second corner 152D of the second area 152 to be fully covered under the first electrode 171 and the second electrode 172, respectively. For example, a margin of about 2.0 μm to about 3.5 μm may be provided from the corners of the first area 151 and the second area 152 to the closest outer edges of the first electrode 171 and the second electrode 172, respectively. Further, the margins from the corners of the second area 152 to the closest edge of the second electrode 172 may be greater than the margins from the corners of the first area 151 to the closest edge of the first electrode 171. For instance, the margin between the first corner 152C of the active layer's second area 152 to the second electrode's edge over the active layer's third area 153 may be longer than the margin between the first corner 151C of the active layer's first area 151 to the first electrode's edge over the active layer's third area 153 by about 0.5 μm or more.

With this setting, DIBL as well as the negative shift in the threshold voltage of the thin film transistor can be suppressed so more robust TFT can be provided in the display device. The configuration also eliminates unwanted side channels in the TFT, thereby enabling more stable operation of the display device.

FIGS. 4A to 4G are exemplary views illustrating a method for fabricating a display device according to embodiments of the present invention.

As shown in FIGS. 4A to 4D, the gate electrode 130, the gate insulating film 140, the active layer 150, and the etch stopper layer 160 are sequentially provided with the first contact hole 161 and the second contact hole 162 on the substrate 120.

Figure 4A:
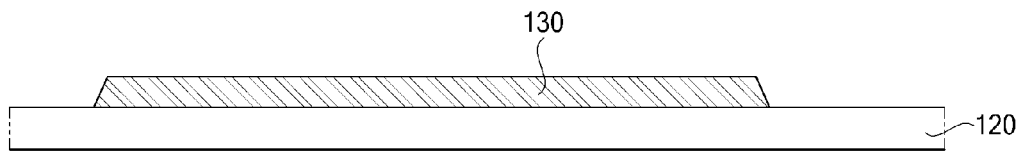
FIGS. 4A to 4G illustrate the configuration of a pixel during manufacturing of a display device, according to an embodiment of the present invention.
Figure 4B:
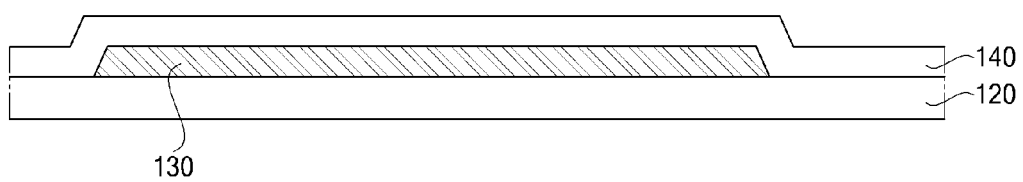
Figure 4C:
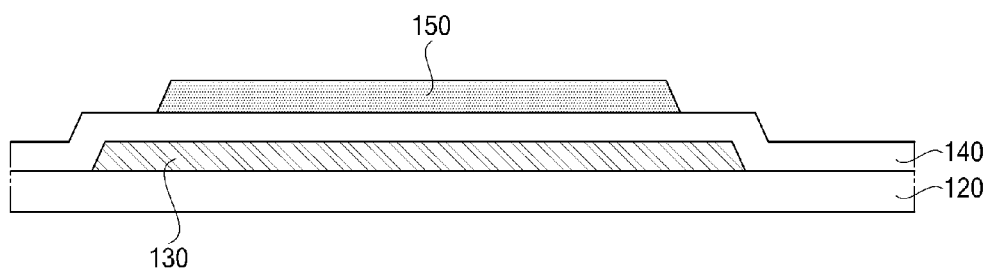
Figure 4D:
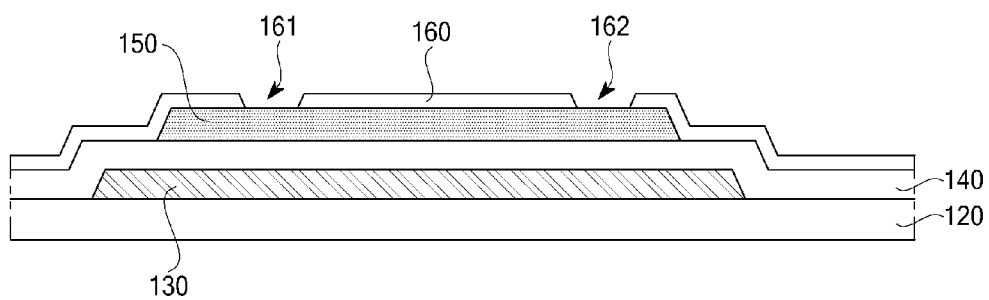
Figure 4E:
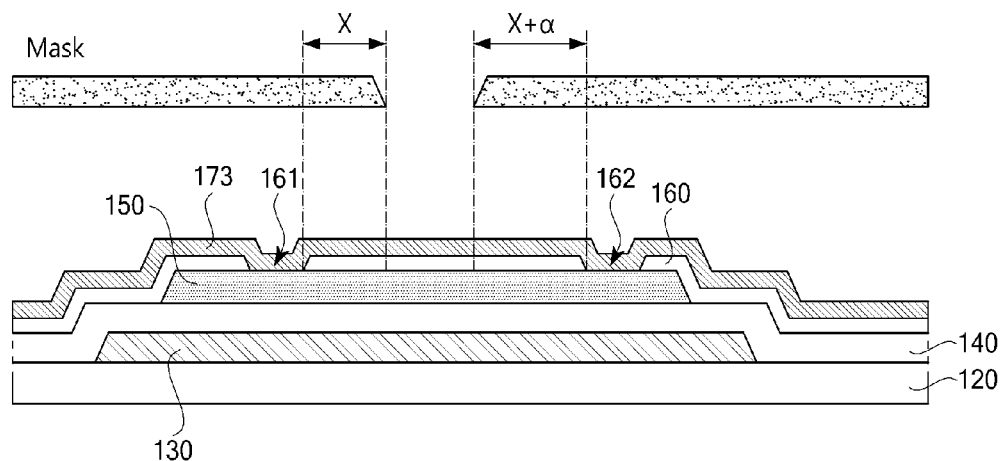
Figure 4F:
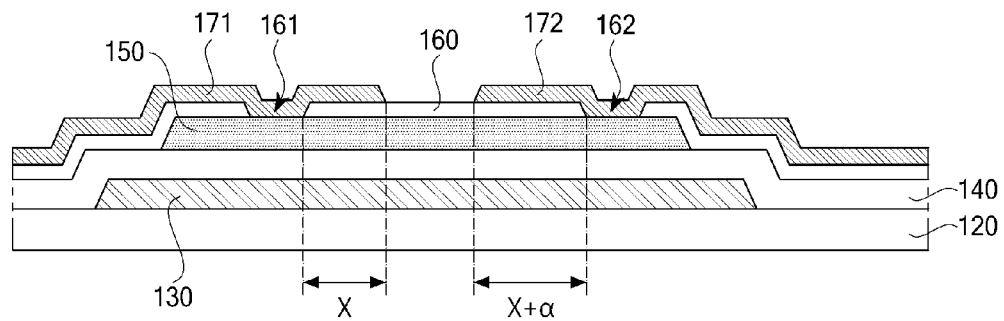
Figure 4G:
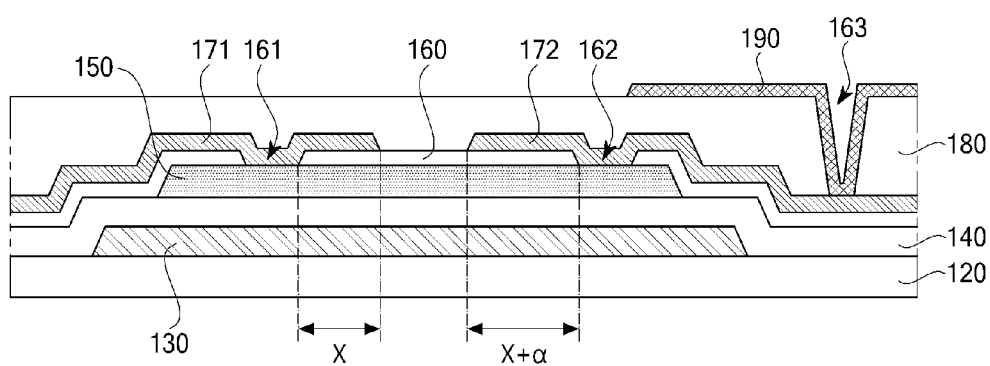

In FIGS. 4E-4G, using a mask, a photo-mask process is performed to form the first electrode 171 and the second electrode 172 so that they are in contact with the active layer 150 through the first contact hole 161 and the second contact hole 162, respectively.

To this end, a conductive layer 173 for forming the first electrode 171 and the second electrode 172 of the TFT is deposited on the etch stopper layer 160 as shown in FIG. 4E. The conductive layer 173 may be formed of Al, W, Cu, Mo, Cr, Ti and a combination thereof, and may be formed in multiple layers of those materials, for instance, a stack of Mo/W, a stack of Mo/Ti and a stack of Cu/Mo/Ti.

In FIG. 4F, a mask can be used to etch selective portions of the conductive layer 173 to provide the first electrode 171 and the second electrode 172. In this regard, the mask is arranged such that the portion of the conductive layer 173 to be etched on top of the etch stopper layer 160 between the first contact hole 161 and the second contact hole 162 are shifted toward the first electrode 171 (i.e., the source electrode side). Accordingly, the length of the conductive layer remaining on the etch stopper layer 160 from the etched area to the second contact hole 162 (i.e., X+α) is longer than the length of the conductive layer remaining on the etch stopper layer 160 from the etched area to the first contact hole 161 (i.e., X).

Further, the mask should have a sufficient size so that the width of the conductive layer 173 that remains on the active layer's first area 151 and the second area 152 is equal to or greater than the width of the active layer's first area 151 and the second area 152, respectively. Moreover, the mask should be positioned so that the first and the second edges (i.e., 151a, 151b) of the active layer's first area 151 as well as the first and the second edges (i.e., 152A, 152B) of the active layer's second area 152 are covered under the conductive layer 173 that remains on the active layer's first area 151 and the second area 152.

With this setting, DIBL as well as the negative shift in the threshold voltage of the thin film transistor can be suppressed so more robust TFT can be provided in the display device. The configuration also eliminates unwanted side channels in the TFT, thereby enabling more stable operation of the display device.

While the method is describe with reference to a display device with a hole type TFT, the features mentioned in the above describe method are equally applicable to a display device with an island type TFT.

As described above, the present invention is not limited to a liquid crystal display device, but may be applied to other types of display devices such as organic light emitting display device, etc. so long as the display device uses an array of oxide thin film transistors.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor comprising:
    a gate electrode;
    a gate insulating film formed on the gate electrode;
    an active layer on the gate insulating film, the active layer being formed of an oxide semiconductor material;
    an etch stopper layer disposed on the active layer;
    a first electrode connected with a data line, in contact with the active layer, and extended above a part of the etch stopper layer disposed on the active layer; and
    a second electrode connected with an electrode of a pixel, in contact with the active layer, and extended above a part of the etch stopper layer disposed on the active layer,
    wherein a length of the second electrode extended toward the first electrode on the etch stopper layer is longer than a length of the first electrode extended toward the second electrode on the etch stopper layer,
    wherein a cross-sectional width of the gate electrode is greater than that of the active layer.

2. The thin film transistor of claim 1, wherein the length of the second electrode extended toward the first electrode on the etch stopper layer is about 0.5 μm or more longer than the length of the first electrode extended toward the second electrode on the etch stopper layer.

3. The thin film transistor of claim 1, wherein the active layer includes a first area, a second area and a third area between the first area and the second area, and wherein the first electrode is arranged on the first area to cover a first edge and a second edge of the active layer at the first area, the second electrode is arranged on the second area to cover a first edge and a second edge of the active area at the second area.

4. The thin film transistor of claim 3, wherein the etch stopper layer is provided further on the first area and the second area of the active layer, the first electrode being in contact with the active layer through a first contact hole provided on the etch stopper layer on the first area, and the second electrode being in contact with the active layer through a second contact hole formed in the etch stopper layer provided on the second area.

5. The thin film transistor of claim 3, wherein a width of the first electrode and the second electrode are wider than the width of the active layer.

6. The thin film transistor of claim 3, wherein a width of the third area is more narrow than widths of the first area and the second area.

7. The thin film transistor of claim 6, wherein the first electrode is arranged to cover a first corner and a second corner of the first area at a border between the first area and the third area, and wherein the second electrode is arranged to cover a first corner and a second corner of the second area at a border between the second area and the third area.

8. The thin film transistor of claim 6, wherein a width of the third area is equal to a width of the first area and a width of the second area.

9. The thin film transistor of claim 8, wherein the etch stopper layer is provided further on the first area and the second area of the active layer, the first electrode being in contact with the active layer through a first contact hole provided on the etch stopper layer on the first area, and the second electrode being in contact with the active layer through a second contact hole formed in the etch stopper layer provided on the second area.

10. The thin film transistor of claim 6, wherein widths of the first area and the second area are about 11.4 μm and the width of the third area is about 10 μm.

11. A display device, comprising:
    an oxide thin film transistor including a gate electrode, a source electrode connected to a first area of an active layer, a drain electrode connected to a second area of the active layer, and an etch stopper layer covering an intermediate area of an active layer between the first area and the second area of the active layer, wherein the etch stopper layer between the first area and the second area is partially covered by the source electrode and the drain electrode such that a length in which the drain electrode is extended toward the source electrode over the etch stopper layer is longer than a length in which the source electrode is extended toward the drain electrode over the etch stopper layer, wherein a cross-sectional width of the gate electrode is greater than that of the active layer.

12. The display device of claim 11, wherein the length in which the drain electrode is extended toward the source electrode over the etch stopper layer is about 0.5 μm or more longer than a length in which the source electrode is extended toward the drain electrode over the etch stopper layer.

13. The display device of claim 11, wherein the source electrode and the drain electrode are arranged on the first area and the second area of the active layer, respectively, such that a first edge and a second edge of the active layer at the first area is covered by the source electrode, and a first edge and a second edge of the active area at the second area is covered by the drain electrode.

14. The display device of claim 13, wherein a width of the intermediate area is more narrow than widths of the first area and the second area.

15. The display device of claim 14, wherein the source electrode is arranged to cover a first corner and a second corner of the first area at a border between the first area and the intermediate area, and wherein the second electrode is arranged to cover a first corner and a second corner of the second area at a border between the second area and the third area.

16. The display device of claim 13, wherein the etch stopper layer is provided further on the first area and the second area of the active layer, the first electrode being in contact with the active layer through a first contact hole provided on the etch stopper layer on the first area, and the second electrode being in contact with the active layer through a second contact hole formed in the etch stopper layer provided on the second area.

17. The display device of claim 13, wherein a width of the intermediate area is equal to a width of the first area and a width of the second area.

18. The display device of claim 17, wherein the etch stopper layer is provided further on the first area and the second area of the active layer, the first electrode being in contact with the active layer through a first contact hole provided on the etch stopper layer on the first area, and the second electrode being in contact with the active layer through a second contact hole formed in the etch stopper layer provided on the second area.

19. The display device of claim 13, wherein a width of the source electrode and the drain electrode are wider than the width of the active layer.

20. The display device of claim 14, wherein widths of the first area and the second area are about 11.4 μm and the width of the intermediate area is about 10 μm.

* * * * *